US006290274B1

(12) United States Patent
Montoya

(10) Patent No.: US 6,290,274 B1
(45) Date of Patent: Sep. 18, 2001

(54) VACUUM SYSTEM AND METHOD FOR SECURING A SEMICONDUCTOR WAFER IN A PLANAR POSITION

(75) Inventor: Thomas T. Montoya, Austin, TX (US)

(73) Assignee: TSK America, Inc., Farmington Hills, MI (US)

( * ) Notice: Subject to any disclaimer, the term of this patent is extended or adjusted under 35 U.S.C. 154(b) by 0 days.

(21) Appl. No.: 09/289,045

(22) Filed: Apr. 9, 1999

(51) Int. Cl.[7] ............................... B66C 1/02; B25B 11/00
(52) U.S. Cl. ........................... 294/64.1; 269/21; 294/907
(58) Field of Search ..................... 294/64.1, 64.3, 294/65, 907; 29/743; 62/270, 331, 336, 337, 378, 404, DIG. 7; 269/21; 279/3; 414/627, 737, 752, 935, 941

(56) References Cited

U.S. PATENT DOCUMENTS

| 3,716,147 | * | 2/1973 | Pipes .................................. 294/65 X |
| 4,561,688 | * | 12/1985 | Tsutsui ................................ 294/64.1 |
| 4,707,012 | | 11/1987 | Takagi ................................ 294/64.1 |
| 4,721,462 | * | 1/1988 | Collins ............................... 269/21 X |
| 5,191,218 | | 3/1993 | Mori et al. . |
| 5,470,117 | * | 11/1995 | Schmidt .............................. 294/64.1 |
| 5,564,682 | * | 10/1996 | Tsuji ................................... 269/21 |
| 5,857,667 | * | 1/1999 | Lee ...................................... 269/21 |
| 6,012,509 | * | 1/2000 | Nonaka .............................. 269/21 X |

* cited by examiner

Primary Examiner—Johnny D Cherry
(74) Attorney, Agent, or Firm—Dykema Gossett PLL

(57) ABSTRACT

A system and method for holding a semiconductor wafer substantially flat on a chuck and for cooling the chuck is provided. The system for securing a wafer on a chuck includes first and second conduits, first and second valves, and a first sensor. The first and second conduits each fluidly connect a first plurality of holes in the chuck to a vacuum source. The first and second valves are disposed within the first and second conduits respectively. The first sensor is in fluid communication with one of the first and second valves. The first sensor measures a first vacuum level applied to one of the first and second valves. In operation, one of the first and second valves opens to induce a vacuum force between the first plurality of holes in the chuck and a wafer disposed on the chuck. When the first vacuum level applied to one of the first and second valves is greater than a predetermined vacuum level, the wafer has been partially pulled down against the chuck. Thereafter, the other valve of first and second valves opens to increase the first vacuum force. The system further includes a cooling gas source fluidly connected to the first conduit. When the first valve is open, the cooling gas source urges gas to flow through the first plurality of holes to cool the chuck.

20 Claims, 3 Drawing Sheets

VACUUM SYSTEM AND METHOD FOR SECURING A SEMICONDUCTOR WAFER IN A PLANAR POSITION

BACKGROUND OF THE INVENTION

1. Field of the Invention

The present invention relates generally to a system that may be used in conjunction with chucks, and, more particularly, to a system and method for securing a semiconductor wafer substantially flat on a chuck and a system and method for cooling a heated chuck.

2. Disclosure of Related Art

Chucks have long been used to fixedly hold semiconductor wafers during testing. Each semiconductor wafer may contain several thousand integrated circuits on a wafer surface that must be tested. Probers having a chuck and a probe card are utilized to make electrical contact with the integrated circuits. Electrical test signals can be transmitted from testers via the probe card to the integrated circuits. The probe cards contain conductive probe needles that make contact with force on conductive test pads disposed on each integrated circuit. The needles contacting the test pads are commonly referred to as "probing."

In at least one known wafer holding system, a vacuum source is connected to a chuck having a plurality of holes to create a vacuum force for holding a wafer against the chuck. However, the known systems have several problems. First, the known systems do not allow for a relatively soft engagement between the chuck and a wafer when the vacuum force is initially induced. The known systems induce a vacuum force that may slam the wafer against the chuck. Slamming the wafer against the chuck may create surface cracks on the wafer resulting in scrapped integrated circuits. Second, the known systems will not pull down a warped wafer resting on the chuck so that it is substantially flat against the chuck. It is essential during wafer testing that the wafer be held flat against the chuck. Holding the wafer flat allows the probe needles to make adequate electrical contact with the integrated circuit test pads. Otherwise, erroneous integrated circuit test failures will occur during testing. Third, the known systems will not quickly cool down a heated chuck used for "hot chuck testing" the wafers. Utilizing known systems, after hot chuck testing the wafers, the chuck must sit idle until it cools to an ambient temperature. Thereafter, the chuck can be used to test wafers at an ambient temperature. Cooling a heated chuck using the ambient atmosphere may take several hours resulting in manufacturing downtime and associated manufacturing costs.

The present invention addresses the need for providing greater control over the wafer flattening process such that the surface of the semiconductor wafer is rendered essentially flat without damaging the wafer. The present invention also addresses the need for cooling a heated chuck relatively quickly as compared with known methods.

SUMMARY OF THE INVENTION

The present invention provides a system and method for securing a semiconductor wafer substantially flat on a chuck and a system and method for cooling a chuck.

One object of the present invention is to provide a system and a method for pulling down a semiconductor wafer against a chuck while providing a relatively soft initial engagement between the chuck and a wafer as compared with known systems.

Another object of the present invention is to provide a system and a method for cooling a chuck to an ambient temperature that is faster than known methods.

A system for securing a wafer on a chuck in accordance with the present invention includes first and second conduits, first and second valves, and a first sensor means. The first and second conduits each fluidly connect a first plurality of holes in the chuck to a vacuum source. The first and second valves are disposed within the first and second conduits respectively. The first sensor means is in fluid communication with one of the first and second valves. The first sensor means measures a first vacuum level applied to one of the first and second valves. One of the first and second valves opens to induce a first vacuum force at the first plurality of holes. When the first vacuum level reaches a predetermined vacuum level, the other of said first and second valves opens to increase the first vacuum force. It should be understood that the two stage increase in vacuum force between the chuck and the wafer allows for a softer initial engagement between the chuck and the wafer as compared with conventional systems.

A system for cooling a chuck in accordance the present invention includes a cooling gas source, a first conduit, and a first valve. The first conduit fluidly connects a first plurality of holes in the chuck to the cooling gas source. The first valve is disposed within the first conduit. When the first valve is open, the cooling gas source urges gas to flow through the first plurality of holes to cool the chuck.

A method of securing a wafer disposed on a chuck in accordance with the present invention involves providing first and second conduits each fluidly connecting a first plurality of holes in the chuck to a vacuum source. The method includes providing first and second valves being disposed within the first and second conduits respectively. The method includes applying a vacuum from the vacuum source to the first and second valves. The method includes opening one of the first and second valves to induce a first vacuum force between the chuck and the wafer. The method includes measuring a first vacuum level applied to one of the first and second valves. Finally, the method includes opening the other of the first and second valves to increase the first vacuum force when the first vacuum level is greater than a predetermined vacuum level.

A method for cooling a chuck in accordance with the present invention involves providing a cooling gas source. The method includes providing a first conduit fluidly connecting a first plurality of holes in the chuck to the cooling gas source. The method includes providing a first valve disposed within the first conduit. The method includes opening the first valve to allow gas from the cooling gas source to flow through the first plurality of holes to cool the chuck.

These and other features and objects of this invention will become apparent to one skilled in the art from the following detailed description and the accompanying drawings illustrating features of this invention by way of example.

DETAILED DESCRIPTION OF THE PREFERRED EMBODIMENTS

Figure 1:
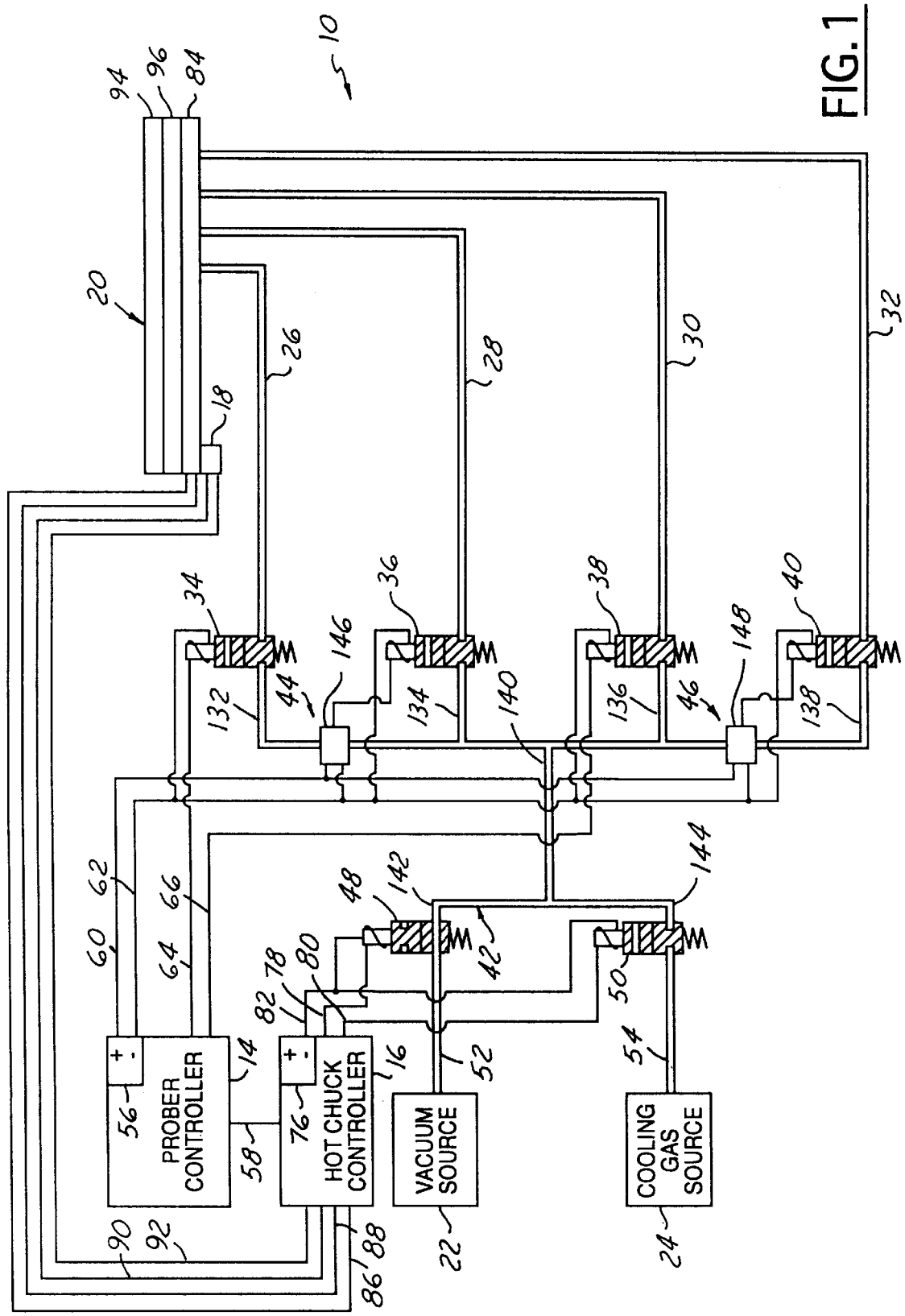
FIG. 1 is a schematic representation of a system for securing a wafer to a chuck and for cooling a heated chuck in accordance with a first embodiment of the present invention.
Figure 2:
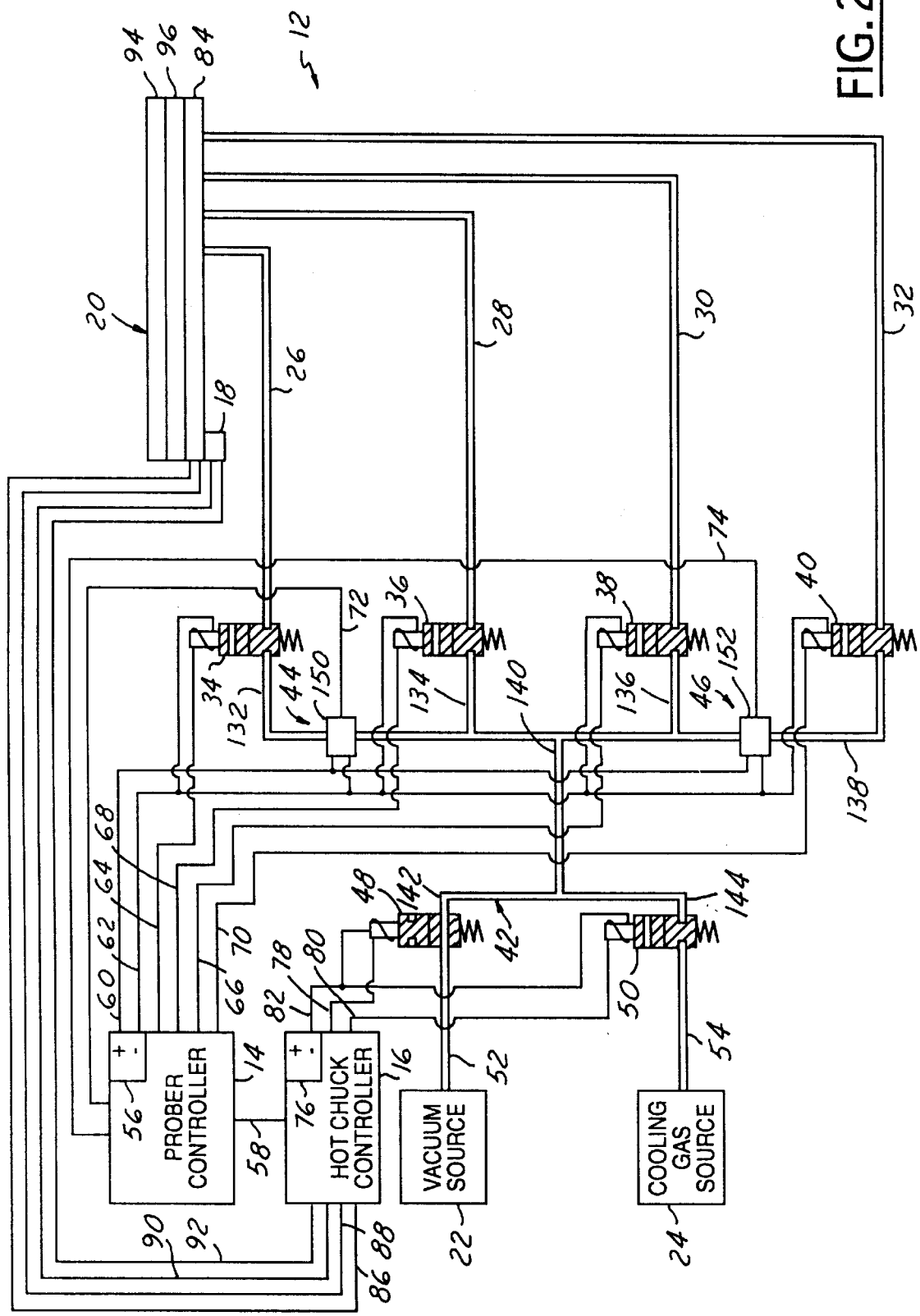
FIG. 2 is a schematic representation of a system for securing a wafer to a chuck and for cooling a heated chuck in accordance with a second embodiment of the present invention.

Referring now to the drawings wherein like reference numerals are used to identify identical components in the various views, FIGS. 1 and 2 illustrate two preferred embodiments, system 10 and system 12, that may be utilized for practicing the present invention. System 10 and system 12 include a prober controller 14, a hot chuck controller 16, a temperature sensor 18, a chuck 20, a vacuum source 22, a cooling gas source 24, conduits 26, 28, 30, 32, valves 34, 36, 38, 40, a manifold 42, sensor means 44, 46, valves 48, 50, and conduits 52, 54.

Prober controller 14 automatically controls valves to connect vacuum source 22 or cooling gas source 24 to chuck 20. Controller 14 is conventional in the art. A suitable controller is the UF 200 Controller manufactured by TSK America, Inc. Controller 14 automatically initiates process steps hereinafter described for controlling systems 10, 12. Controller 14 enables an operator to input operational parameters such as a wafer diameter (i.e., 150 mm or 200 mm) and the type of testing (i.e., ambient temperature testing or hot chuck testing). Controller 14 has an internal power supply 56 producing a voltage potential between a positive and negative terminal. Referring to FIGS. 1 and 2, in both a first and second preferred embodiment, controller 14 is electrically connected to hot chuck controller 16 via line 58 for communication therebetween. Further, controller 14 is electrically connected to both sensor means 44, 46 via lines 60, 62. Supply 56 induces a voltage potential between lines 60, 62 to energize sensor means 44, 46. Line 62 is electrically connected to a first end of coils on valves 34, 36, 38, 40 to provide an electrical ground thereto. Further, controller 14 is electrically connected to a second end of coils on valves 34, 38 via lines 64, 66 respectively. Controller 14 may selectively apply or remove a voltage via lines 64, 66 to open or close valves 34, 38.

Referring to FIG. 2, in a second preferred embodiment, controller 14 is further electrically connected to a second end of coils on valves 36, 40 via lines 68, 70 respectively. Controller 14 may selectively apply or remove a voltage via lines 68, 70 to open or close valves 36, 40. Controller 14 is further electrically connected to sensor means 44, 46 via lines 72, 74 respectively. Controller 14 may monitor via line 72 a first vacuum signal produced by sensor means 44. Controller 14 may open one of valves 34, 36 responsive to the first vacuum signal. Controller 14 may monitor a second vacuum signal via line 74 produced by sensor means 46. Controller 14 may open one of valves 38, 40 responsive to the second vacuum signal.

Referring to FIGS. 1 and 2, hot chuck controller 16 operates in conjunction with controller 14 to automatically control valves 48, 50. Valves 48, 50 connect vacuum source 22 or cooling gas source 24 to manifold 42. Controller 16 is conventional in the art. A suitable controller is model number TRDC-J1-34-R2-2E manufactured by TSK America, Inc. Controller 16 is capable of automatically initiating process steps hereinafter described. Controller 16 has an internal power supply 76 producing voltage potential between a positive and a negative terminal. As described previously, controller 16 is electrically connected to controller 14 via line 58 for communication therebetween. Further, controller 16 is electrically connected to a first end of coils on valves 48, 50 via lines 78, 80 respectively.

Controller 16 is further electrically connected to a second end of coils on valves 48, 50 via line 82 that provides an electrical ground thereto. Controller 16 may control the closing and opening of valve 48 by selectively applying or removing a voltage via line 78. Controller 16 may control the opening and closing of valve 50 by selectively applying or removing a voltage via line 80. Further, controller 16 is electrically connected to a heating coil 84 via lines 86, 88. Controller 16 may selectively apply or remove a voltage potential between lines 86, 88 to energize coil 84 to produce heat during hot chuck testing. Further, controller 16 is electrically connected to a temperature sensor 18 via lines 90, 92 for measuring the temperature of chuck 20.

Sensor 18 is preferably mounted on chuck 20 and produces a temperature signal corresponding to the temperature of chuck 20. Controller 16 monitors the temperature signal via lines 90, 92. Controller 16 may control the opening and closing of valves 48, 50 responsive to the temperature signal.

Referring to FIG. 1, chuck 20 is provided for holding semiconductor wafers having one of two different diameters. Chuck 20 may include a chuck plate 94, a seal plate 96, and a heating coil 84.

Figure 3:
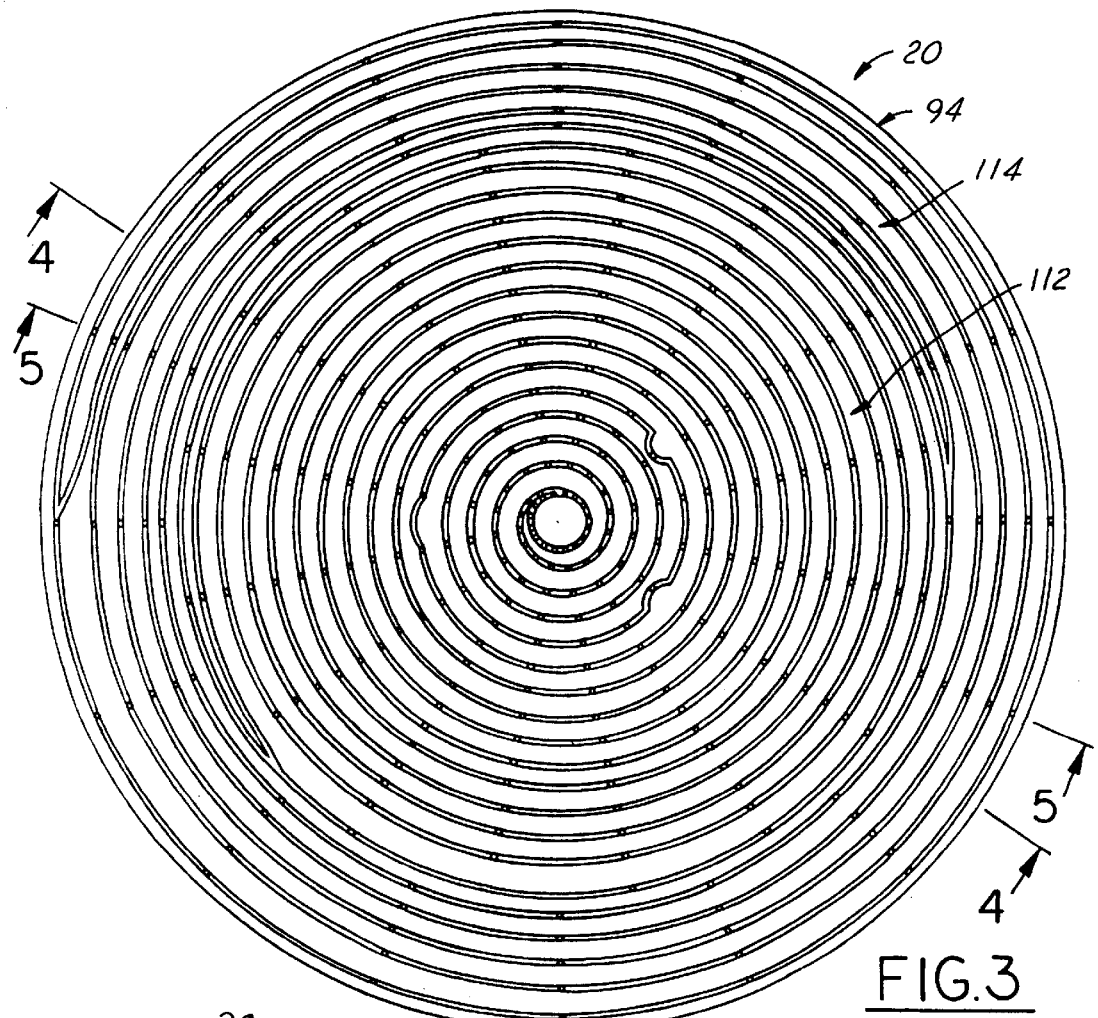
FIG. 3 is a plan view of the chuck of FIG. 1.
Figure 4:
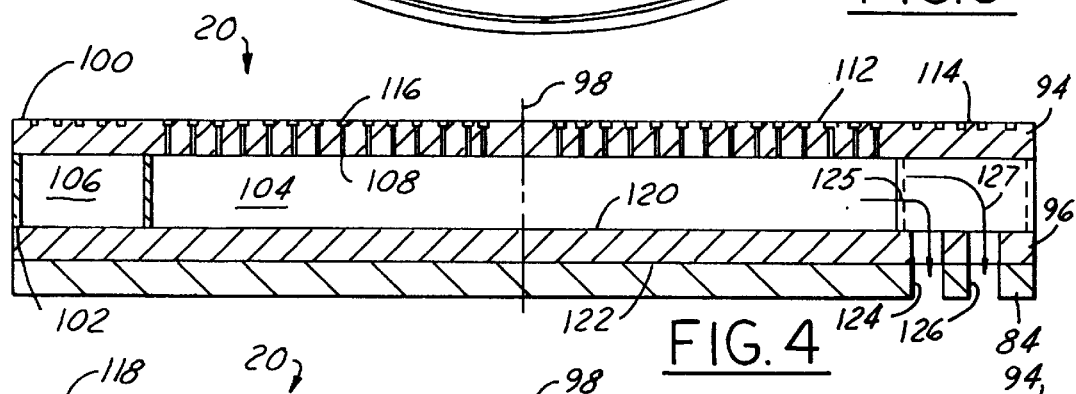
FIG. 4 is a sectional view of the chuck of FIG. 3 in the direction of arrows 4.
Figure 5:
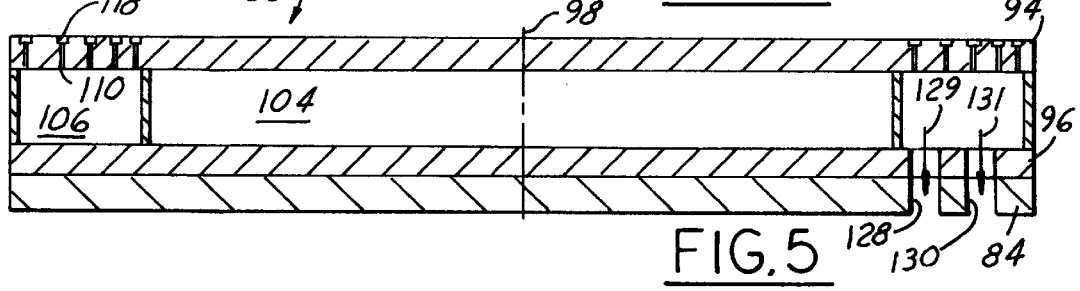
FIG. 5 is a sectional view of the chuck of FIG. 3 in the direction of arrows 5.

Chuck plate 94 is provided to support and fixedly hold a semiconductor wafer. Preferably, plate 94 is constructed from alumina or zirconia. Both materials have low thermal expansion properties and provide minimal transmission of electrical noise. Referring to FIGS. 4 and 5, plate 94 is disposed about first axis 98 and has a side 100, and a side 102. Plate 94 further includes reservoirs 104, 106 which provide a path for air to flow from holes 108, 110 respectively, to vacuum source 22 (See FIG. 1). Reservoirs 104, 106 may define a pair of voids that extend from side 102 of plate 94 into plate 94. Reservoir 104 may be generally cylindrical in shape while reservoir 106 may be generally split-ring shaped and may surround reservoir 104. Referring to FIGS. 3 and 4, plate 94 may further include regions 112, 114 to support a wafer having a first or second diameter. Region 112 may be generally circular in shape while region 114 may be a ring-shaped region that surrounds region 112. Referring to FIG. 4, regions 112, 114 are disposed on side 100 of plate 94. Regions 112, 114 are substantially flat regions and preferably have a planarity of 400±100 Å. The diameter of region 112 may correspond to the diameter of a first conventional wafer (not shown). Further, the diameter of region 114 may correspond to the diameter of a second conventional wafer (not shown) larger than the diameter of the first conventional wafer. For example, region 112 may have a diameter of 150 mm corresponding to a 150 mm wafer while region 114 may have a diameter of 200 mm corresponding to a 200 mm wafer. Referring to FIGS. 4 and 5, plate 94 may further include grooves 116, 118. Grooves 116, 118 may be disposed within regions 112, 114, respectively, and extend from side 100 into plate 94. Grooves 116, 118 provide a path for air to flow from regions 104, 106, respectively, to holes 108, 110, respectively. Air flowing through grooves 116, 118 induces a suction force on a wafer disposed on regions 112, 114.

Seal plate 96 is provided to seal against chuck plate 94 to enclose reservoirs 104, 106. Preferably, plate 96 is constructed from alumina or zirconia. Both materials have low thermal expansion properties and provide minimal transmission of electrical noise. Plate 96 has a side 120 and a side 122 opposite side 120 and is preferably generally cylindrical in shape. Side 120 of plate 96 may be integral with side 102 of chuck plate 94. Alternately, side 120 of plate 96 may be fixedly attached to side 102 of plate 94 utilizing ceramic glazing or high temperature glue.

As previously discussed, heating coil 84 is provided to increase the temperature of chuck 20 to a predetermined temperature for hot chuck testing the wafers. Coil 84 is conventional in the art and produces heat when a current flows therethrough. Coil 84 may be fixedly attached to seal plate 96. Inlet holes 124, 126, and inlet holes 128, 130 may extend through coil 84 and plate 96. Inlet holes 124, 126 and inlet holes 128, 130 provide a path for air to flow from reservoirs 104, 106 respectively, of chuck 20 to vacuum source 22. More specifically, vacuum source 22 may induce air to flow from reservoir 104 through inlet holes 124, 126 as shown by arrows 125, 127 respectively. Further, source 22 may induce air to flow from reservoir 106 through inlet holes 128, 130 as shown by arrows 129, 131 respectively. As previously discussed, coil 84 is electrically connected to hot chuck controller 16 which controls the energization of coil 84.

Referring to FIGS. 1 and 2, vacuum source 22 is provided to induce a vacuum force between a wafer and chuck 20. Vacuum source 22 is conventional in the art and preferably supplies a vacuum of at least 17 inches Hg. Vacuum source 22 is fluidly connected to valve 48 via conduit 52.

Cooling gas source 24 provides a cooling gas used for cooling chuck 20. Source 24 is conventional in the art and may supply pressurized air or nitrogen. Source 24 is fluidly connected to valve 50 via conduit 54.

Referring to FIGS. 1, 4, and 5, conduits 26, 28 and conduits 30, 32 are provided to fluidly connect holes 108 and holes 110, respectively, of chuck 20 to vacuum source 22. Alternately, conduits 26, 28 and conduits 30, 32 may be utilized to allow gas to flow from cooling gas source 24 to holes 108 and holes 110, respectively, of chuck 20. Conduits 26, 28, 30, 32 are conventional in the art and may be constructed from a plurality of materials including plastics and rubber. Further, conduits 26, 28, 30, 32 are preferably tubular shaped. Referring to FIGS. 1 and 4, conduits 26, 28 connect on a first end to inlet holes 124, 126 respectively. Conduits 26, 28 connect on a second end to valves 34, 36 respectively. Referring to FIGS. 2 and 5, conduits 30, 32 connect on a first end to inlet holes 128, 130 respectively. Conduits 30, 32 connect on a second end to valves 38, 40 respectively.

Referring to FIGS. 1 and 2, valves 34, 36, 38, 40 are provided to control the flow of gas through conduits 26, 28, 30, 32, respectively. Valves 34, 36, 38, 40 are conventional in the art and are preferably electromagnetically actuated valves. A suitable valve is model number R2WFBW423GL000F manufactured by Pisco, USA, Inc. Valves 34, 36, 38, 40 are disposed within conduits 26, 28, 30, 32 respectively. More specifically, valves 34, 36, 38, 40 are disposed between a first end of conduits 26, 28, 30, 32, respectively, and outlet branches 132, 134, 136, 138, respectively, of manifold 42. Valves 34, 36, 38, 40 have a normally closed condition where gas is prevented from flowing therethrough. Upon energization, valves 34, 36, 38, 40 have an open condition where gas is allowed to flow therethrough. Referring to FIG. 1, in a first embodiment, controller 14 controls the opening and closing of valves 34, 38. Sensor means 44 controls the opening and closing of valve 36 responsive to a vacuum level applied to one of valves 34, 36. Sensor means 46 controls the opening and closing of valve 40 responsive to a vacuum level applied to one of valves 38, 40. Referring to FIG. 2, in a second embodiment, controller 14 controls the opening and closing of valves 34, 36, 38, and 40. Controller 14 controls the opening of valves 36, 40 responsive to vacuum signals produced by sensor means 44, 46 respectively.

Referring to FIGS. 1 and 2, manifold 42 is provided to fluidly connect valves 34, 36, 38, 40 to vacuum source 22 or cooling gas source 24. Manifold 42 may be constructed from the same material and have the same cross-sectional shape as conduits 26, 28, 30, 32. Manifold 42 has outlet branches 132, 134, 136, 138, an intermediate branch 140, and inlet branches 142, 144. Intermediate branch 140 connects inlet branches 142, 144 to outlet branches 132, 134, 136, 138. It should be understood that branches 132, 134, 136, 138, 140, 142, 144 are all in fluid communication with one another. Outlet branches 132, 134, 136, 138 fluidly connect valves 34, 36, 38, 40, respectively to vacuum source 22 and cooling gas source 24.

Sensor means 44 and sensor means 46 are provided to measure a vacuum level applied to one of valves 34, 36 and one of valves 38, 40, respectively. Sensor means 44 may be disposed within either outlet branch 132 or outlet branch 134 of manifold 42. Sensor means 46 may be disposed within either outlet branch 136 or outlet branch 138 of manifold 42. Referring to FIG. 1, in a first embodiment, sensor means 44, 46 are conventional vacuum actuated switches 146, 148 respectively. A suitable switch is model number VUS20G-6B manufactured by Pisco, USA, Inc. Switches 146, 148 close an internal contact (not shown) or relay when a measured vacuum level is greater than a predetermined vacuum level to thereby open valves 36, 40, respectively. Further, switches 146, 148 close the internal contact when a measured vacuum is less than or equal to a predetermined vacuum level to thereby open valves 36, 40, respectively. More specifically, switches 146, 148 may open valves 36, 40, respectively, when a measured vacuum in conduits 132, 136, respectively, is greater than 17 inches Hg. Switches 146, 148 may close valves 36, 40, respectively, when a measured vacuum in conduits 132, 136, respectively, is less than or equal to 17 inches Hg. Referring to FIG. 2, in a second embodiment, sensor means 44, 46, may be conventional vacuum sensors 150, 152. A suitable vacuum sensor is part number 2758-52EU manufactured by Granville-Phillips, Corporation. Vacuum sensors 150, 152 each produce vacuum signals proportional to the measured vacuum in conduits 132, 136, respectively.

Referring to FIGS. 1 and 2, valve 48 is provided to connect manifold 42 to vacuum source 22 whereas valve 50 is provided to connect manifold 42 to cooling gas source 24. Valves 48, 50 are conventional in the art and may be identical in structure and functionality as valves 34, 36, 38, 40. valves 48, 50 are disposed within inlet branches 142, 144, respectively, of manifold 42. More specifically, valve 48 is disposed between inlet branch 142 and vacuum source 22. Valve 50 is disposed between inlet branch 144 and cooling gas source 24. Valve 48 has a normally open condition where gas is allowed to flow therethrough to vacuum source 22. Accordingly, a vacuum from vacuum source 22 is applied to valves 34, 36, 38, 40. Upon energization, valve 48 closes to prevent gas from flowing therethrough. Valve 50 has a normally closed condition where gas is prevented from flowing therethrough. Upon energization, valve 50 opens to allow gas from cooling gas source 24 to flow to valves 34, 36, 38, 40. It should be understood that when valve 48 is in the open condition, valve 50 is in the closed condition and vice versa. As previously discussed, hot chuck controller 16 may control the closing and opening of valves 48, 50.

Before proceeding with a detailed description of the method for securing a wafer using systems 10, 12, a general overview of the operation of the systems 10, 12 will be set forth. The present invention may be utilized to secure wafers having two different diameters on a single chuck. For example, the present invention may secure a wafer having a 150 mm diameter or a 200 mm diameter on a single chuck. Prior to the testing of semiconductor wafers, an operator may input operational parameters into prober controller 14, such as the wafer diameter (i.e., 150 mm or 200 mm) and the type of testing (i.e., ambient temperature testing or hot chuck testing). Although 150 mm and 200 mm wafers will be utilized in the discussion hereinafter, the indicated diameters do not limit in any manner the diameter of wafer that may be secured by the present invention. The operational parameter corresponding to the wafer diameter may be utilized by controller 14 to determine if a suction force will be induced within region 112 (see FIG. 3) or within regions 112 and 114. More specifically, a suction force will be induced only in region 112 to secure a relatively small wafer (i.e., 150 mm wafer) having a diameter substantially the same as region 112. Alternately, a suction force will be induced in region 112 and region 114 to hold a larger wafer (i.e., 200 mm wafer) having a diameter substantially the same as region 114.

Referring to FIG. 4, the general methodology for securing a wafer (i.e., 150 mm or 200 mm wafer) on chuck 20 includes inducing a first vacuum force between holes 108 (within region 112) and the wafer. When a first measured vacuum level is greater than a predetermined vacuum level, the wafer has been partially pulled down against chuck 20 in region 112. Thereafter, the first vacuum force will be increased to further pull down the wafer against chuck 20. Referring to FIG. 5, if a suction force is needed within regions 112 and 114 (i.e., for 200 mm wafers), a second vacuum force would be induced between holes 110 (within region 114) and the wafer. When a second measured vacuum level is greater than a predetermined vacuum level, the wafer has been partially pulled down against chuck 20 in region 114. Thereafter, the second vacuum force will be increased to further pull down the wafer against chuck 20. The two-step pull-down method in regions 112 and 114 provides a relatively soft initial engagement between the wafer and chuck 20 resulting in fewer surface cracks on wafers as compared with known methods.

Referring to FIGS. 1 and 4, a method for securing a wafer disposed on chuck 20 utilizing system 10 in accordance with the present invention will be described. The method for securing a wafer utilizing system 10 or system 12 is substantially similar and any differences will be specifically indicated. The inventive method may include the step of providing conduits 26, 28 each fluidly connecting holes 108 in chuck 20 to a vacuum source 22. The inventive method may include the step of providing valves 34, 36 being disposed within conduits 26, 28, respectively. The inventive method may include applying a vacuum from vacuum source 20 to valves 34, 36. More specifically, prober controller 14 may instruct hot chuck controller 16 to keep valve 48 open to allow a vacuum to be applied from vacuum source 22 to valves 34, 36. The inventive method may further include opening one of valves 34, 36 to induce a first vacuum force between chuck 20 and a wafer (not shown). More specifically, controller 14 may open valve 34 to induce the first vacuum force in region 112 of chuck 20. The inventive method may further include measuring a first vacuum level applied to one of valves 34, 36. It should be understood that either vacuum switch 146 (see FIG. 1) or vacuum sensor 150 (see FIG. 2) may be used to measure the first vacuum level applied to one of valves 34, 36. The inventive method may further include opening the other of valves 34, 36 to increase the first vacuum force when the first vacuum level is greater than a predetermined vacuum level. It should be understood that either vacuum switch 146 (see FIG. 1) or controller 14 (see FIG. 2) may be used to open one of valves 34, 36 to increase the first vacuum force when the first vacuum level is greater than a predetermined vacuum level such as 17 inches Hg.

Referring to FIGS. 1 and 5, the inventive method may further include the step of providing conduits 30, 32 each fluidly connecting holes 110 in chuck 20 to vacuum source 22. The method may include providing valves 38, 40 disposed within conduits 30, 32, respectively. The method may include applying a vacuum from vacuum source 22 to valves 38, 40. More specifically, prober controller 14 may instruct hot chuck controller 16 to keep valve 48 open to allow a vacuum to be applied from vacuum source 22 to valves 38, 40. The method may further include opening one of valves 38, 40 to induce a second vacuum force between chuck 20 and a wafer (not shown). More specifically, controller 14 may open one of valves 38 to induce the second vacuum force in region 114 of chuck 20. The method may further include measuring the second vacuum level applied to one of valves 38, 40. It should be understood that either vacuum switch 148 (see FIG. 1) or vacuum sensor 152 (see FIG. 2) may be used to measure the second vacuum level applied to one of valves 38, 40. The inventive method may finally include opening the other of valves 38, 40 to increase the second vacuum force when the second vacuum level is greater than a predetermined vacuum level. It should be understood that either switch 148 (see FIG. 1) or controller 14 (see FIG. 2) may be used to open one of valves 38, 40 to increase the second vacuum force when the second vacuum level is greater than a predetermined vacuum level such as 17 inches Hg.

Referring to FIGS. 1 and 4, a method for cooling a chuck in accordance with the present invention will be described. The inventive method may be performed by system 10 or system 12 utilizing identical steps. The inventive method may include the step of providing a cooling gas source 24. The method may include providing a conduit 26 fluidly connecting holes 108 in chuck 20 to cooling gas source 24. The method may further include providing valve 34 disposed within conduit 26. The method may further include opening valve 34 to allow gas from cooling gas source 24 to flow through holes 108 to cool chuck 20. More specifically, controller 14 may open valve 34 to allow gas to flow therethrough. The inventive method may further include the step of providing conduit 30 fluidly connecting holes 110 in chuck 20 to cooling gas source 24. The method may further include providing a valve 38 disposed within conduit 30. The method may further include opening valve 38 to allow gas from cooling gas source 24 to flow through holes 110 to cool chuck 20. Finally, the method may further include measuring the temperature of chuck 20 and closing valve 38 when the temperature of chuck 20 falls below a predetermined temperature level.

Systems 10, 12 and the securing and cooling methods in accordance with the present invention represents a significant improvement over the prior art. First, systems 10, 12 and the method of securing a semiconductor wafer enable a relatively soft initial engagement between a chuck and a wafer, thereby reducing cracked wafers. Second, systems 10, 12 and the method for cooling a heated chuck enable a chuck to be cooled relatively quickly to a predetermined temperature as compared with known methods.

While the invention has been particularly shown and described with reference to the preferred embodiments thereof, it is well understood by those skilled in the art that various changes and modifications can be made in the invention without departing from the spirit and the scope of the invention.

I claim:

1. A system for securing a wafer on a chuck, comprising:
    first and second conduits each fluidly connecting a first plurality of holes in said chuck to a vacuum source;
    first and second valves being disposed within said first and second conduits, respectively; and,
    a first sensor means in fluid communication with one of said first and second valves for measuring a first vacuum level applied to one of said first and second valves, wherein one of said first and second valves opens to induce a first vacuum force at said first plurality of holes and when said first vacuum level is greater than a predetermined vacuum level, the other of said first and second valves opens to increase said first vacuum force.

2. The system of claim 1 wherein said first and second valves are electromagnetically actuated.

3. The system of claim 1 further comprising a manifold that has a first and second outlet branch that fluidly connects said first and second valves, respectively, to said vacuum source.

4. The system of claim 3 wherein said first sensor means comprises a first vacuum sensor disposed within one of said first and second outlet branches, said first vacuum sensor producing a first vacuum signal corresponding to said first vacuum level.

5. The system of claim 4 further comprising a controller that monitors said first vacuum signal and controls the opening and closing of said first and second valves, said controller opening one of said first and second valves responsive to said first vacuum signal.

6. The system of claim 3 further comprising a third valve disposed within a first inlet branch of said manifold, said third valve opening to allow a vacuum from said vacuum source to be applied to said first and second valves.

7. The system of claim 6 further comprising a cooling system including a cooling gas source and a fourth valve, said fourth valve being disposed between a second inlet branch of said manifold and said cooling gas source, said fourth valve opening to allow a cooling gas from said cooling gas source to be applied to said first and second valves.

8. The system of claim 3 further comprising:
    third and fourth conduits each fluidly connecting a second plurality of holes in said chuck to said vacuum source;
    third and fourth valves being disposed within said third and fourth conduits, respectively; and,
    a second sensor means in fluid communication with one of said third and fourth valves for measuring a second vacuum level applied to one of said third and fourth valves, wherein one of said third and fourth valves opens to induce a second vacuum force at said second plurality of holes and when said second vacuum level is greater than a predetermined vacuum level, the other of said third and fourth valves opens to increase said second vacuum force.

9. The system of claim 8 wherein said third and fourth valves are electromagnetically actuated valves.

10. The system of claim 8 wherein said manifold has a third and fourth outlet branch that fluidly connects said third and fourth valves, respectively, to said vacuum source.

11. The system of claim 10 wherein said second sensor means comprises a second vacuum sensor disposed within one of said third and fourth outlet branches, said second vacuum sensor producing a second vacuum signal corresponding to said second vacuum level.

12. The system of claim 11 further comprising a controller that monitors said second vacuum signal and controls the opening and closing of said third and fourth valves, said controller opening one of said third and fourth valves responsive to said second vacuum signal.

13. A system for securing a wafer on a chuck, comprising:
    first and second conduits each fluidly connecting a first plurality of holes in said chuck to a vacuum source;
    first and second valves being disposed within said first and second conduits, respectively;
    a first sensor means in fluid communication with one of said first and second valves for measuring a first vacuum level applied to one of said first and second valves, wherein one of said first and second valves opens to induce a first vacuum force at said first plurality of holes and when said first vacuum level is greater than a predetermined vacuum level, the other of said first and second valves opens to increase said first vacuum force;
    a manifold that has a first and second outlet branch that fluidly connects said first and second valves respectively, to said vacuum source; and
    wherein said first sensor means comprises a first vacuum actuated switch disposed within one of said first and second outlet branches of said manifold, said first vacuum actuated switch controlling the opening and closing of one of said first and second valves responsive to said first vacuum level.

14. The system of claim 13 further comprising a controller that controls the opening and closing of the other of said first and second valves.

15. A system for securing a wafer on a chuck, comprising:
    first and second conduits each fluidly connecting a first plurality of holes in said chuck to a vacuum source;
    first and second valves being disposed within said first and second conduits, respectively;
    a first sensor means in fluid communication with one of said first and second valves for measuring a first vacuum level applied to one of said first and second valves, wherein one of said first and second valves opens to induce a first vacuum force at said first plurality of holes and when said first vacuum level is greater than a predetermined vacuum level, the other of said first and second valves opens to increase said first vacuum force;
    a manifold that has a first and second outlet branch that fluidly connects said first and second valves respectively, to said vacuum source;
    third and fourth conduits each fluidly connecting a second plurality of holes in said chuck to said vacuum source;
    third and fourth valves being disposed within said third and fourth conduits, respectively;
    a second sensor means in fluid communication with one of said third and fourth valves for measuring a second vacuum level applied to one of said third and fourth valves, wherein one of said third and fourth valves opens to induce a second vacuum force at said second plurality of holes and when said second vacuum level is greater than a predetermined vacuum level, the other of said third and fourth valves opens to increase said second vacuum force;
    wherein said manifold has a third and fourth outlet branch that fluidly connects said third and fourth valves, respectively, to said vacuum source; and wherein said second sensor means comprises a second vacuum actuated switch disposed within one of said third and fourth outlet branches of said manifold, said second vacuum actuated switch controlling the opening and closing of one of said third and fourth valves responsive to said second vacuum level.

16. The system of claim 15 further comprising a controller that controls the opening and closing of the other of said third and fourth valves.

17. A system for securing a wafer on a chuck, comprising:
first and second conduits each fluidly connecting a first plurality of holes in said chuck to a vacuum source;
first and second valves being disposed within said first and second conduits, respectively;
a first sensor means in fluid communication with one of said first and second valves for measuring a first vacuum level applied to one of said first and second valves, wherein one of said first and second valves opens to induce a first vacuum force at said first plurality of holes and when said first vacuum level is greater than a predetermined vacuum level, the other of said first and second valves opens to increase said first vacuum force;
a manifold that has a first and second outlet branch that fluidly connects said first and second valves respectively, to said vacuum source;
third and fourth conduits each fluidly connecting a second plurality of holes in said chuck to said vacuum source;
third and fourth valves being disposed within said third and fourth conduits, respectively;
a second sensor means in fluid communication with one of said third and fourth valves for measuring a second vacuum level applied to one of said third and fourth valves, wherein one of said third and fourth valves opens to induce a second vacuum force at said second plurality of holes and when said second vacuum level is greater than a predetermined vacuum level, the other of said third and fourth valves opens to increase said second vacuum force;
wherein said manifold has a third and fourth outlet branch that fluidly connects said third and fourth valves, respectively, to said vacuum source; and
a fifth valve disposed within a second inlet branch of said manifold, said fifth valve opening to allow a vacuum from said vacuum source to be applied to said third and fourth valves.

18. A system for securing a wafer on a chuck, comprising:
a chuck having a first plurality of holes;
first and second conduits each fluidly connecting said first plurality of holes in said chuck to a vacuum source;
first and second valves being disposed within said first and second conduits, respectively; and,
a first sensor means in fluid communication with one of said first and second valves for measuring a first vacuum level applied to one of said first and second valves, wherein one of said first and second valves opens to induce a first vacuum force at said first plurality of holes and when said first vacuum level is greater than a predetermined vacuum level, the other of said first and second valves opens to increase said first vacuum force.

19. A method for securing a wafer disposed on a chuck, comprising the steps of:
providing first and second conduits each fluidly connecting a first plurality of holes in said chuck to a vacuum source;
providing first and second valves being disposed within said first and second conduits, respectively; and
applying a vacuum from said vacuum source to said first and second valves;
opening one of said first and second valves to induce a first vacuum force between said chuck and said wafer;
measuring a first vacuum level applied to one of said first and second valves; and,
opening the other one of said first and second valves to increase said first vacuum force when said first vacuum level is greater than a predetermined vacuum level.

20. A method for securing a wafer disposed on a chuck, comprising the steps of:
providing first and second conduits each fluidly connecting a first plurality of holes in said chuck to a vacuum source;
providing first and second valves being disposed within said first and second conduits, respectively; and
applying a vacuum from said vacuum source to said first and second valves;
opening one of said first and second valves to induce a first vacuum force between said chuck and said wafer;
measuring a first vacuum level applied to one of said first and second valves;
opening the other one of said first and second valves to increase said first vacuum force when said first vacuum level is greater than a predetermined vacuum level;
providing third and fourth conduits each fluidly connecting a second plurality of holes in said chuck to said vacuum source;
providing third and fourth valves being disposed within said third and fourth conduits, respectively; and
applying a vacuum from said vacuum source to said third and fourth valves;
opening one of said third and fourth valves to induce a second vacuum force between said chuck and said wafer;
measuring a second vacuum level applied to one of said third and fourth valves; and,
opening the other one of said third and fourth valves to increase said second vacuum force when said second vacuum level is greater than said predetermined vacuum level.

* * * * *